US009064905B2

(12) United States Patent
Jeong et al.

(10) Patent No.: US 9,064,905 B2
(45) Date of Patent: Jun. 23, 2015

(54) ARRAY SUBSTRATE AND METHOD OF FABRICATING THE SAME

(71) Applicant: LG Display Co., Ltd., Seoul (KR)

(72) Inventors: Ho-Young Jeong, Gyeonggi-do (KR); Young-Jang Lee, Seoul (KR); Bok-Young Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/914,773

(22) Filed: Jun. 11, 2013

(65) Prior Publication Data

US 2014/0159033 A1 Jun. 12, 2014

(30) Foreign Application Priority Data

Dec. 7, 2012 (KR) ........................ 10-2012-0141792

(51) Int. Cl.

*H01L 29/786* (2006.01)
*H01L 29/66* (2006.01)
*H01L 27/12* (2006.01)

(52) U.S. Cl.

CPC ...... *H01L 29/66969* (2013.01); *H01L 29/7869* (2013.01); *H01L 27/1225* (2013.01)

(58) Field of Classification Search

CPC ..................... H01L 2021/775; H01L 29/7869; H01L 27/1225; H01L 27/1214; H01L 27/1222; H01L 27/124; H01L 27/3244; H01L 27/3246; H01L 27/3241; H01L 27/32; H01L 27/3258; H01L 27/326; H01L 27/3262
USPC .............. 257/43, E29.296, E29.151, E51.005
See application file for complete search history.

(56) References Cited

U.S. PATENT DOCUMENTS

| | | | | |
|---|---|---|---|---|
| 5,561,075 | A * | 10/1996 | Nakazawa | 438/30 |
| 6,288,414 | B1 * | 9/2001 | Ahn | 257/72 |
| 6,380,559 | B1 * | 4/2002 | Park et al. | 257/59 |
| 6,867,108 | B2 * | 3/2005 | Jeong et al. | 438/384 |
| 6,943,367 | B2 * | 9/2005 | Kim et al. | 257/25 |
| 7,972,898 | B2 * | 7/2011 | Cowdery-Corvan et al. | 438/104 |
| 2003/0089910 | A1 * | 5/2003 | Inukai | 257/66 |
| 2006/0208258 | A1 * | 9/2006 | Yamazaki | 257/66 |
| 2007/0296003 | A1 * | 12/2007 | Park et al. | 257/288 |
| 2009/0101895 | A1 * | 4/2009 | Kawamura et al. | 257/43 |
| 2009/0184315 | A1 * | 7/2009 | Lee et al. | 257/43 |
| 2010/0176388 | A1 * | 7/2010 | Ha et al. | 257/40 |
| 2012/0161126 | A1 * | 6/2012 | Yamazaki | 257/43 |

FOREIGN PATENT DOCUMENTS

| | | | |
|---|---|---|---|
| KR | 1020050013953 | A | 5/2005 |
| KR | 1020050000681 | A | 6/2005 |
| KR | 1020090117582 | A | 12/2009 |

* cited by examiner

*Primary Examiner* — Matthew W Such
*Assistant Examiner* — Samuel Lair
(74) *Attorney, Agent, or Firm* — Morgan, Lewis & Bockius LLP

(57) ABSTRACT

An array substrate includes a substrate; an oxide semiconductor layer on the substrate, the oxide semiconductor layer including an active area and source and drain areas at both sides of the active area; a gate insulating layer and a gate electrode sequentially on the active area of the oxide semiconductor layer; an inter insulating layer on the gate electrode and having first and second semiconductor contact holes that expose the source and drain areas respectively; and source and drain electrodes on the inter insulating layer and contacting the source and drain areas through the first and second semiconductor contact holes, respectively, wherein the first and second semiconductor contact holes are disposed in two regions.

11 Claims, 10 Drawing Sheets

ARRAY SUBSTRATE AND METHOD OF FABRICATING THE SAME

This application claims the priority benefit of Korean Patent Application No. 10-2012-0141792, filed on Dec. 7, 2012, which is hereby incorporated by reference in its entirety.

BACKGROUND OF THE INVENTION

1. Field of the Invention

The present invention relates to an array substrate, and more particularly, to an array substrate including a thin film transistor with an oxide semiconductor layer and a method of fabricating the same.

2. Discussion of the Related Art

With rapid development of information technologies, display devices for displaying a large amount of information have been promptly developed. More particularly, flat panel display (FPD) devices having a thin profile, light weight and low power consumption such as organic electroluminescent display (OLED) devices and liquid crystal display (LCD) devices have been actively pursued and are replacing the cathode ray tubes (CRTs).

Among the liquid crystal display devices, active matrix type liquid crystal display devices, which include thin film transistors to control on/off the respective pixels, have been widely used because of their high resolution, color rendering capability and superiority in displaying moving images.

In addition, organic electroluminescent display devices have been recently spotlighted because they have many merits as follows: the organic electroluminescent display devices have high brightness and low driving voltages; because they are self-luminous, the organic electroluminescent display devices have excellent contrast ratios and ultra thin thicknesses; the organic electroluminescent display devices have a response time of several micro seconds, and there are advantages in displaying moving images; the organic electroluminescent display devices have wide viewing angles and are stable under low temperatures; since the organic electroluminescent display devices are driven by a low voltage of direct current (DC) 5V to 15V, it is easy to design and manufacture driving circuits; and the manufacturing processes of the organic electroluminescent display device are simple since only deposition and encapsulation steps are required. In the organic electroluminescent display devices, active matrix type display devices also have been widely used because of their low power consumption, high definition and large-sized possibility.

Each of the active matrix type liquid crystal display devices and the active matrix type organic electroluminescent display devices includes an array substrate having thin film transistors as switching elements to control on/off their respective pixels.

FIG. 1 is a cross-sectional view of illustrating an array substrate for a liquid crystal display device or for an organic electroluminescent display device according to the related art. FIG. 1 shows a cross-section of a pixel region including a thin film transistor in the array substrate.

In FIG. 1, a gate line (not shown) and a data line (not shown) are formed on a substrate 11 and cross each other to define a pixel region P. A gate electrode 15 is formed at a switching region TrA of the pixel region P. A gate insulating layer 18 is formed on the gate electrode 15, and a semiconductor layer 28, which includes an active layer 22 of intrinsic amorphous silicon and ohmic contact layers 26 of impurity-doped amorphous silicon, is formed on the gate insulating layer 18. Source and drain electrodes 36 and 38 are formed on the ohmic contact layers 26. The source and drain electrodes 36 and 38 correspond to the gate electrode 15 and are spaced apart from each other. The gate electrode 15, the gate insulating layer 18, the semiconductor layer 28, and the source and drain electrodes 36 and 38 sequentially formed at the switching region TrA constitute a thin film transistor Tr.

A passivation layer 42 is formed on the source and drain electrodes 36 and 38 and the exposed active layer 22 all over the substrate 11. The passivation layer 42 has a drain contact hole 45 exposing a portion of the drain electrode 38. A pixel electrode 50 is formed independently in each pixel region P on the passivation layer 42. The pixel electrode 50 contacts the drain electrode 38 through the drain contact hole 45.

Here, although not shown in the figure, a semiconductor pattern is formed under the data line. The semiconductor pattern has a double-layered structure including a first pattern of the same material as the ohmic contact layers 26 and a second pattern of the same material as the active layer 22.

In the semiconductor layer 28 formed at the switching region TrA of the related art array substrate, the active layer 22 of intrinsic amorphous silicon has different thicknesses depending on the position. That is, a portion of the active layer 22 exposed by selectively removing the ohmic contact layers 26 has a first thickness t1 and a portion of the active layer 22 under the ohmic contact layers 26 has a second thickness t2, which is thicker than the first thickness t1. The different thicknesses of the different portions of the active layer 22 result from a manufacturing method, and this decreases the output characteristics of the thin film transistor Tr and negatively affects the performance of the thin film transistor Tr because the active layer 22 between the source and drain electrodes 36 and 38, which becomes a channel of the thin film transistor Tr, has a reduced thickness.

To address this problem, a thin film transistor having an oxide semiconductor layer of a single layer, which does not need the related art ohmic contact layers and which uses an oxide semiconductor material as an active layer, has been developed.

FIG. 2 is a plan view illustrating a part of a pixel region for an array substrate that includes a thin film transistor having such an oxide semiconductor layer according to the related art, and FIG. 3 is a cross-sectional view taken along the line III-III of FIG. 2.

In FIG. 2 and FIG. 3, an oxide semiconductor layer 63 is formed at each pixel region on a transparent insulating layer such as substrate 61. The oxide semiconductor layer 63 has a bar shape. A gate electrode 69 is formed in correspondence to a central portion of the oxide semiconductor layer 63, and a gate insulating layer 66 is disposed between the oxide semiconductor layer 63 and the gate electrode 69.

At this time, the oxide semiconductor layer 63 includes an active area 63*a* and source and drain areas 63*b* and 63*c*. The active area 63*a* corresponds to the gate electrode 69 and has a semiconducting property. The source and drain areas 63*b* and 63*c* are exposed at both sides of the gate insulating layer 66 and have conducting properties different from the active area 63*a*.

A gate line 68 is also formed on the gate insulating layer 66. The gate line 68 is connected to the gate electrode 69 and extends in a first direction. Here, the gate electrode 69 extends from the gate line 68 along a second direction.

An inter insulating layer 72 of an inorganic insulating material is formed on the gate electrode 69 and the gate insulating layer 66. The inter insulating layer 72 includes first and second semiconductor contact holes 74*a* and 74*b*, which expose the source and drain areas 63*b* and 63*c* of the oxide semiconductor layer 63, respectively, at both sides of the gate electrode 69. The first and second semiconductor contact holes 74*a* and 74*b* are formed in the same pixel region P and are arranged in a line along the first direction, which is a direction of a width of the pixel region P shorter than a length of the pixel region P.

Source and drain electrodes 76 and 77 are formed on the inter insulating layer 72. The source and drain electrodes 76 and 77 contact the source and drain areas 63*b* and 63*c* through the first and second semiconductor contact holes 74*a* and 74*b*, respectively.

A data line 75 is also formed on the inter insulating layer 72 is connected to the source electrode 76. The data line 75 extends in a second direction and crosses the gate line 68 to thereby define the pixel region P. The source electrode 76 extends from the data line 75 along the first direction.

A passivation layer 78 is formed on the source and drain electrodes 76 and 77, and a pixel electrode 85 is formed on the passivation layer in the pixel region P. The pixel electrode 85 contacts the drain electrode 77 through a drain contact hole 80 of the passivation layer 78.

In the array substrate including the thin film transistor Tr of FIGS. 2 and 3 having the oxide semiconductor layer 63, the oxide semiconductor layer 63 has a single-layered structure without the ohmic contact layers. Thus, the oxide semiconductor layer 63 is not exposed to etching gases used in a dry-etching process for forming the ohmic contact layers 26 of FIG. 1. Therefore, the output characteristics of the thin film transistor Tr is prevented from being lowered and minimized.

Meanwhile, recently, products having full high definition, such as a TV having high definition of 1080 by 1920, for example, have been preferred. Personal portable devices such as a tablet PC or a cellular phone, which is relatively small as compared with a TV, also need a high definition display.

Even though a TV has high definition of 1080 by 1920, the TV has a relatively large pixel size. However, the personal portable device such as a tablet PC or a cellular phone has a relatively small pixel size for high definition because its display size is several inches.

The array substrate shown in FIG. 2 may be applied to a TV. Here, the pixel region P has relatively large size, so that the oxide thin film transistor Tr including the first and second semiconductor contact holes 74*a* and 74*b*, which are arranged in a direction parallel to a width of the pixel region P, can be formed in one pixel region P.

However, when the array substrate shown in FIG. 2 is applied to a device having a relatively small display size such as the tablet PC or the cellular phone, it is not possible that the oxide thin film transistor including two contact holes along a width direction of the pixel region is formed in one pixel region because the width of the pixel region is relatively very narrow.

That is, the oxide thin film transistor having the coplanar structure includes the first and second semiconductor contact holes exposing the source and drain areas of the oxide semiconductor layer, and the semiconductor contact holes need a minimum size more than a predetermined area for contacting with the oxide semiconductor layer. Therefore, when the minimum size is considered, a width of the oxide thin film transistor may be larger than the width of the pixel region, and it is difficult to form the oxide thin film transistor having the coplanar structure in each pixel region of an array substrate for a high definition device.

Moreover, although the oxide thin film transistor having the coplanar structure is formed in each pixel region, there is a problem that the aperture ratio decreases due to the relatively large size of the oxide thin film transistor.

SUMMARY OF THE INVENTION

Accordingly, the present invention is directed to an array substrate including an oxide thin film transistor and a method of fabricating the same that substantially obviate one or more of the problems due to limitations and disadvantages of the related art.

An object of the present invention is to provide an array substrate including an oxide thin film transistor and a method of fabricating the same that are applicable for a high definition device.

Another object of the present invention is to provide an array substrate including an oxide thin film transistor and a method of fabricating the same that improve the aperture ratio.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an array substrate includes a substrate; an oxide semiconductor layer on the substrate, the oxide semiconductor layer including an active area and source and drain areas at both sides of the active area; a gate insulating layer and a gate electrode sequentially on the active area of the oxide semiconductor layer; an inter insulating layer on the gate electrode and having first and second semiconductor contact holes that expose the source and drain areas respectively; and source and drain electrodes on the inter insulating layer and contacting the source and drain areas through the first and second semiconductor contact holes, respectively, wherein the first and second semiconductor contact holes are disposed in two regions.

Preferably, the oxide semiconductor layer may have a bent portion, and both ends of the bent portion correspond to the first and second semiconductor contact holes respectively.

Preferably, the bent portion may have an L-like shape.

Preferably, the array substrate further comprises: a gate line on the gate insulating layer along a first direction and connected to the gate electrode; and a data line on the inter insulating layer along a second direction, the data line crossing the gate line to define plural pixel regions, wherein the two regions are arranged across two pixel regions adjacent to each other along the second direction in a direction parallel to a length of one pixel region, which is longer than a width of the one pixel region.

Preferably, the array substrate further comprises: a gate line on the gate insulating layer along a first direction and connected to the gate electrode; and a data line on the inter insulating layer along a second direction, the data line crossing the gate line to define plural pixel regions, wherein the two regions are adjacent to each other along the second direction and one of the two regions is the last pixel region connected to the last gate line where the second semiconductor contact hole for the last pixel region is formed, and another of the two regions is a region where the first semiconductor contact hole for the last pixel region connected to the last gate line is formed in correspondence to the data line extending in a non-display region.

Preferably, the array substrate further comprises: a gate line on the gate insulating layer along a first direction; and a data line on the inter insulating layer along a second direction, the data line crossing the gate line to define first and second pixel regions adjacent to each other along the second direction, wherein a part of the gate line is the gate electrode, and a part of the data line is the source electrode.

Preferably, the drain electrode may be located in the first pixel region and the source electrode may be located in the data line beside the second pixel region.

Preferably, the oxide semiconductor layer may be formed of an oxide semiconductor material which has an increased conducting property when it is exposed to plasma using one or more selected from helium, argon and hydrogen.

Preferably, the oxide semiconductor material may include one of indium gallium zinc oxide, zinc tin oxide, and zinc indium oxide.

Preferably, the active area may be a portion of the oxide semiconductor layer which overlaps the gate electrode and is not treated by plasma, and the source and drain areas may be portions of the oxide semiconductor layer which do not overlap the gate electrode and treated by plasma to have improved conducting properties.

Preferably, the array substrate further comprises: a passivation layer on the source and drain electrodes and having a drain contact hole exposing the drain electrode; and a pixel electrode on the passivation layer and contacting the drain electrode through the drain contact hole, wherein the drain contact hole overlaps the second semiconductor contact hole.

In another aspect, a method of fabricating an array substrate comprises: forming an oxide semiconductor layer on a substrate, the oxide semiconductor layer including an active area and source and drain areas at both sides of the active area; sequentially forming a gate insulating layer and a gate electrode on the active area of the oxide semiconductor layer; plasma-treating the source and drain areas of the oxide semiconductor layer using one or more selected from helium, argon and hydrogen, thereby increasing a conducting property of the source and drain areas; forming an inter insulating layer on the gate electrode and having first and second semiconductor contact holes that expose the source and drain areas, respectively; and forming source and drain electrodes on the inter insulating layer and contacting the source and drain areas through the first and second semiconductor contact holes, respectively, wherein the first and second semiconductor contact holes are disposed in two regions.

Preferably, the oxide semiconductor layer may have a bent portion, and both ends of the bent portion correspond to the first and second semiconductor contact holes respectively.

Preferably, the bent portion may have an L-like shape.

Preferably, forming the gate electrode may include forming a gate line along a first direction and connected to the gate electrode, wherein forming the source and drain electrodes includes forming a data line on the inter insulating layer along a second direction, the data line crossing the gate line to define plural pixel regions, and wherein the two regions are arranged across two pixel regions adjacent to each other along the second direction in a direction parallel to a length of one pixel region, which is longer than a width of the one pixel region.

Preferably, forming the gate electrode may include forming a gate line along a first direction and connected to the gate electrode, wherein forming the source and drain electrodes includes forming a data line on the inter insulating layer along a second direction, the data line crossing the gate line to define plural pixel regions, and, wherein the two regions are adjacent to each other along the second direction and one of the two regions is the last pixel region connected to the last gate line where the second semiconductor contact hole for the last pixel region is formed, and another of the two regions is a region where the first semiconductor contact hole for the last pixel region connected to the last gate line is formed in correspondence to the data line extending in a non-display region.

Preferably, forming the gate electrode may include forming a gate line along a first direction, wherein forming the source and drain electrodes includes forming a data line on the inter insulating layer along a second direction, the data line crossing the gate line to define first and second pixel regions adjacent to each other along the second direction, and wherein a part of the gate line is the gate electrode, and a part of the data line is the source electrode.

Preferably, the drain electrode may be located in the first pixel region and the source electrode may be located in the data line beside the second pixel region.

Preferably, the oxide semiconductor material may include one of indium gallium zinc oxide, zinc tin oxide, and zinc indium oxide.

Preferably, the active area may be a portion of the oxide semiconductor layer which overlaps the gate electrode and is not treated by plasma, and the source and drain areas may be portions of the oxide semiconductor layer which do not overlap the gate electrode and treated by plasma to have improved conducting properties.

Preferably, the method further comprises: forming a passivation layer on the source and drain electrodes and having a drain contact hole exposing the drain electrode; and forming a pixel electrode on the passivation layer and contacting the drain electrode through the drain contact hole, wherein the drain contact hole overlaps the second semiconductor contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to embodiments of the present invention, examples of which are illustrated in the accompanying drawings. Wherever possible, similar reference numbers will be used to refer to the same or similar parts.

Figure 1:
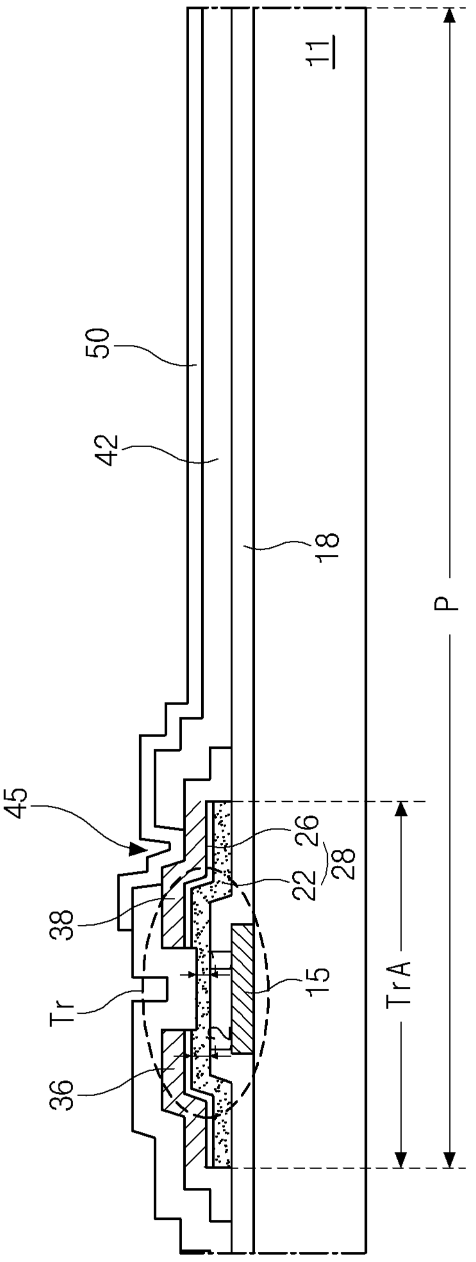
FIG. 1 is a cross-sectional view illustrating an array substrate for a liquid crystal display device or for an organic electroluminescent display device according to the related art.
Figure 2:
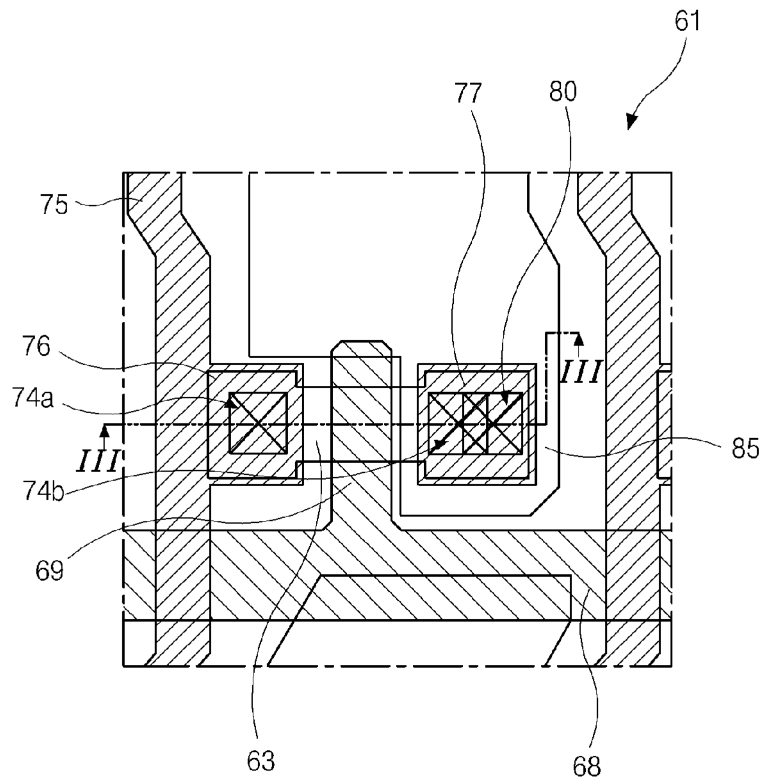
FIG. 2 is a plan view illustrating a part of a pixel region for an array substrate that includes a thin film transistor having such an oxide semiconductor layer according to the related art.
Figure 3:
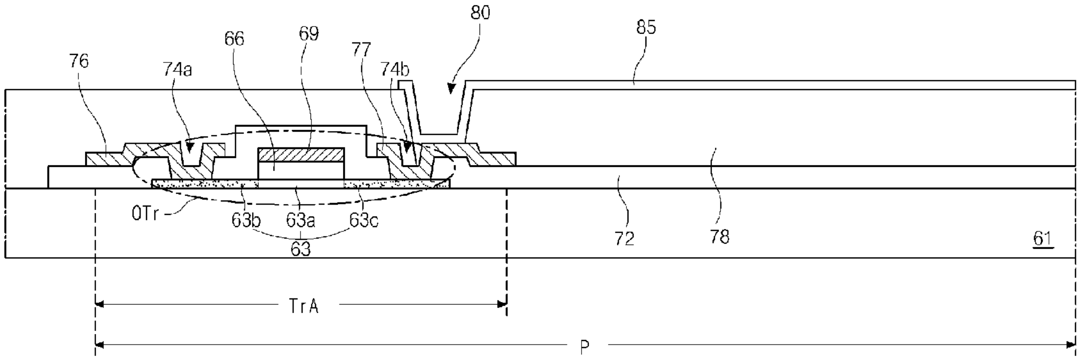
FIG. 3 is a cross-sectional view taken along the line III-III of FIG. 2.
Figure 4:
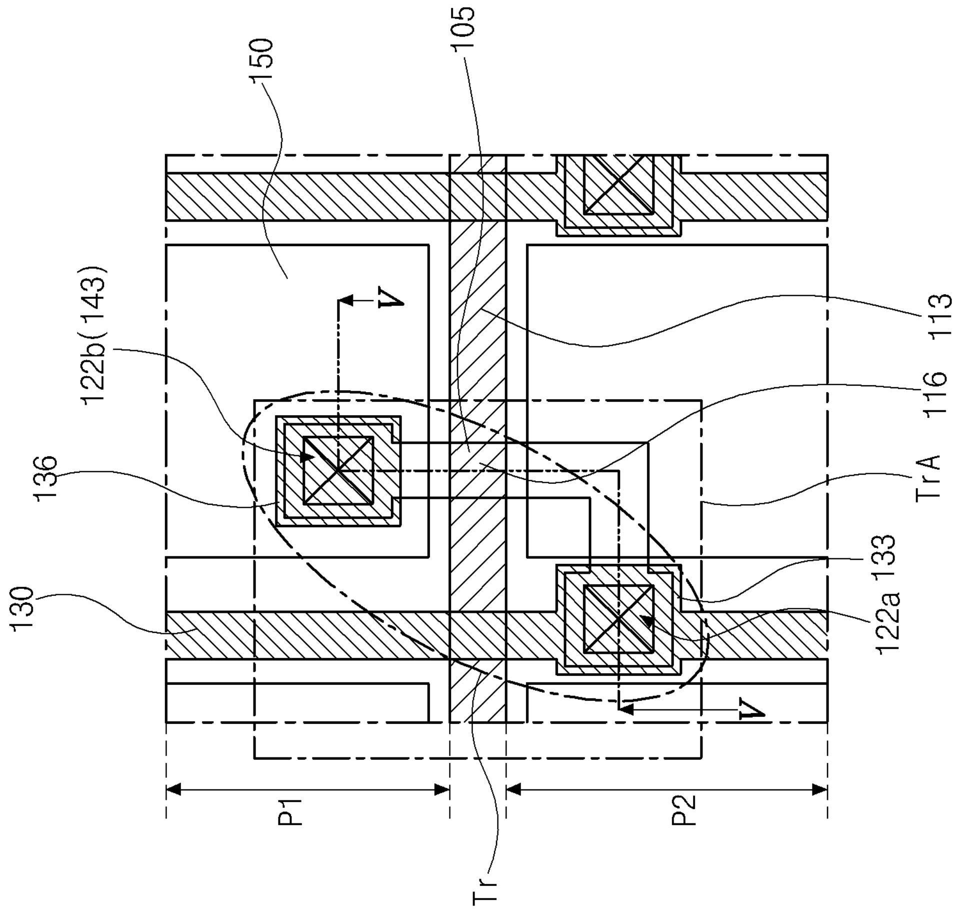
FIG. 4 is a plan view illustrating a part of an array substrate including an oxide thin film transistor having an oxide semiconductor layer according to an embodiment of the present invention.

FIG. 4 is a plan view illustrating a part of an array substrate including an oxide thin film transistor having an oxide semiconductor layer according to an embodiment of the present invention. For convenience of explanation, a region where the oxide thin film transistor is located is defined as a switching region TrA.

In FIG. 4, a gate line 113 of a first direction and a data line 130 of a second direction cross each other to thereby define first and second pixel regions P1 and P2 adjacent to each other along the second direction.

An oxide thin film transistor Tr, as a switching element, is connected to a crossing portion of the gate line 113 and the data line 130. The oxide thin film transistor Tr is disposed across the first and second pixel regions P1 and P2. The oxide thin film transistor Tr includes an oxide semiconductor layer 105, which may have a bent portion and one end of which is disposed in the first pixel region P1 and the other end of which is disposed in the second pixel region P2 or in a data line beside the second pixel region P2.

The oxide thin film transistor Tr includes the oxide semiconductor layer 105, a gate electrode 116, and source and drain electrodes 133 and 136. The oxide semiconductor layer 105 is formed on a substrate (not shown), and the gate electrode 116 is formed over the oxide semiconductor layer 105. The oxide semiconductor layer 105 at both sides of the gate electrode 116 is exposed by first and second semiconductor contact holes 122*a* and 122*b*. The source and drain electrodes 133 and 136 contact the oxide semiconductor layer 105 through the first and second semiconductor contact holes 122*a* and 122*b*, respectively. The oxide thin film transistor Tr has a coplanar structure.

In the oxide thin film transistor Tr, the oxide semiconductor layer 105 may have any shapes formed between its both ends. In that case, a source electrode of one oxide thin film transistor Tr and a drain electrodes of another oxide thin film transistor Tr can be disposed in one pixel region (including a data line beside the pixel region) along a length of the pixel region which is longer than a width of the pixel region. Therefore, even though the size of the pixel regions P1 and P2 decreases for the high definition, the oxide thin film transistor Tr having a coplanar structure can be formed to switch on/off each pixel region P1 and P2. Preferably, the oxide semiconductor layer 105 includes at least one bent portion, such as an L-like shape, so that a part of the data line 130 is the source electrode 133, and a part of the gate line 113 is the gate electrode 116.

Additionally, the source electrode 133 of the oxide thin film transistor Tr, which switches the first pixel region P1, is disposed in the second pixel region P2 or a data line beside the second pixel region P2 adjacent to the first pixel region P1 along the second direction. The drain electrode 136 of the oxide thin film transistor Tr, which switches the first pixel region P1, is disposed in the first pixel region P1.

At this time, the first semiconductor contact hole 122*a* corresponds to the source electrode 133, and the second semiconductor contact hole 122*b* corresponds to the drain electrode 136. The source electrode 133 contacts a source area of the oxide semiconductor layer 105 through the first semiconductor contact hole 122*a*, and the drain electrode 136 contacts a drain area of the oxide semiconductor layer 105 through the second semiconductor contact hole 122*b*.

In the present invention, the first and second semiconductor contact holes 122*a* and 122*b*, which need certain sizes, are not arranged in one pixel region, for example, the first pixel region P1, in a line along the first direction parallel to a short length of the first or second pixel region P1 or P2. That is, the first and second semiconductor contact holes 122*a* and 122*b* are disposed in the second and first pixel regions P2 (including a data line of the second pixel region) and P1, respectively, which are adjacent to each other along the second direction parallel to a long length of the first or second pixel region P1 or P2. Therefore, even though sizes of the first and second pixel regions P1 and P2 decrease for a full high definition display device, the oxide thin film transistor Tr can be formed to have a coplanar structure.

Meanwhile, in the oxide thin film transistor Tr spreading in the first and second pixel regions P1 and P2, the oxide semiconductor layer 105 includes an active area and the source and drain areas. The active area overlaps the gate electrode 116 and is not treated by plasma. The source and drain areas are disposed at both sides of the active area and do not overlap the gate electrode 116. The source and drain areas are treated by plasma and have the improved conducting properties.

A pixel electrode 150 is formed at each of the first and second pixel regions P1 and P2. The pixel electrode 150 in the first pixel region P1 is connected to the drain electrode 135 of the oxide thin film transistor Tr, and the pixel electrode 150 in the second pixel region P2 is connected to a drain electrode of another oxide thin film transistor (not shown).

When the array substrate is used for a liquid crystal display device, a common electrode may be further formed on the array substrate. To apply a common voltage to the common electrode, a common line may be also formed on the array substrate, and the common line may be formed of the same material on the same layer as the gate line 113 or the data line 130.

For example, when the array substrate is used for an in-plane switching mode liquid crystal display device, a common electrode may be formed on the same layer or on a different layer from the pixel electrode, and each of the common electrode and the pixel electrode 150 may have bar-shaped patterns, which alternate each other.

Alternatively, when the array substrate is used for a fringe-field switching mode liquid crystal display device, a common electrode may be formed on a different layer from the pixel electrode and overlap the pixel electrode. One of the common electrode and the pixel electrode may have bar-shaped openings at each pixel region P1 and P2.

In the meantime, when the array substrate is used for an organic electroluminescent display device, the pixel electrode 150 has a size corresponding to each pixel region P1 and P2 and is a first electrode of an organic light-emitting diode, which may act as a cathode electrode or an anode electrode.

In the array substrate, since a pixel region connected to the last gate line in a display region does not have a neighboring pixel region along the second direction, it seems that there is no switching region for the pixel region connected to the last gate line.

However, the data line 130 extends into a non-display region out of the display region and is connected to a data link line or a data pad electrode in the non-display region, or there is a dummy pixel region in the non-display region.

Accordingly, the first semiconductor contact hole 122*a* for the pixel region connected to the last gate line 113 is formed in correspondence to the data line 130 extending in the non-display region, and the source electrode 133 for the pixel region connected to the last gate line 113 is formed in correspondence to the first semiconductor contact hole 122*a*.

In the array substrate mentioned above, the switching region TrA is disposed across two pixel regions P1 and P2 adjacent to each other along the direction parallel to the data line 130, and the first and second semiconductor contact holes 122*a* and 122*b* respectively exposing the source and drain areas 105*b* and 105*c* of the oxide semiconductor layer 105 are arranged in a direction parallel to the length of the pixel regions P1 and P2 larger than the width of the pixel regions P1 and P2. Therefore, even though the size of the pixel regions P1 and P2 decreases for the high definition, for example, 1080 by 1920, the oxide thin film transistor Tr having a coplanar structure can be formed to switch on/off each pixel region P1 and P2.

Moreover, since the part of the gate line 113 is used as the gate electrode 116 and the part of the data line 130 is used as the source electrode, the size of the oxide thin film transistor Tr decreases, and the aperture ratio in each pixel region P1 and P2 increases.

A cross-sectional structure of an array substrate according to an embodiment of the present invention will be described hereinafter.

Figure 5:
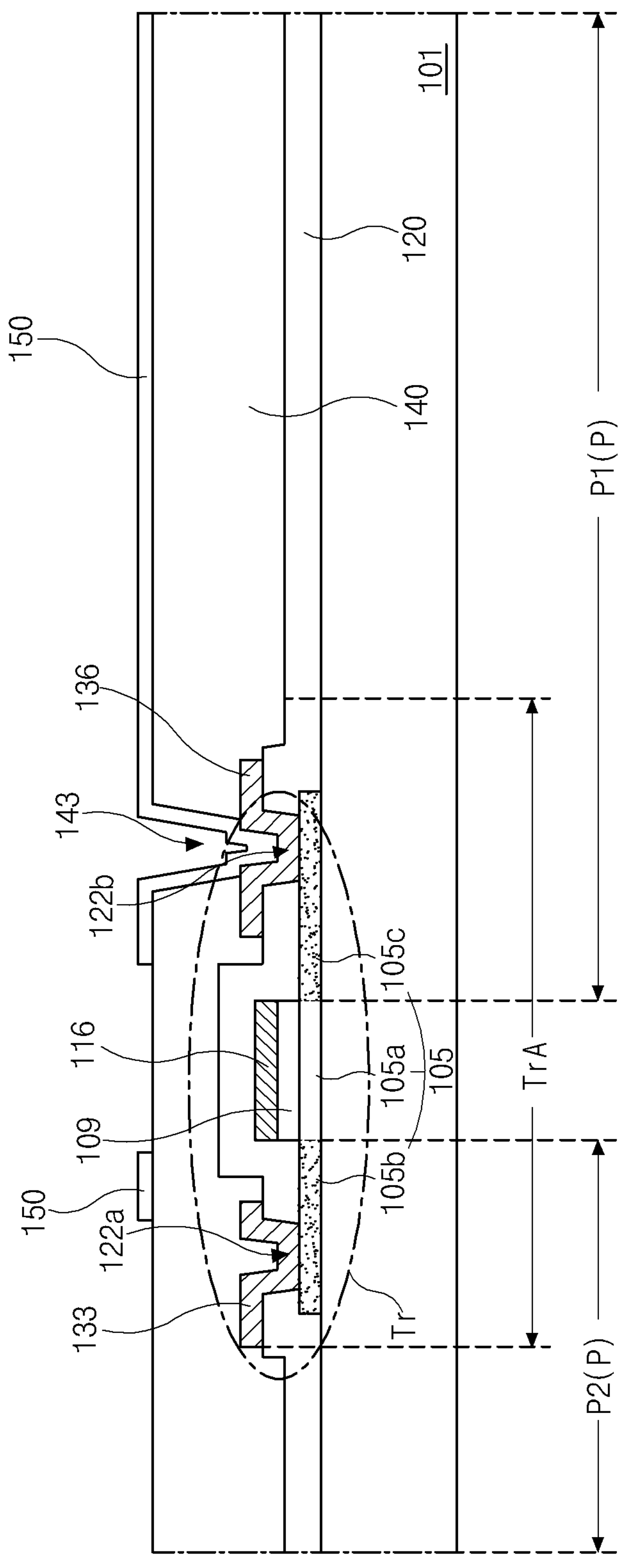
FIG. 5 is a cross-sectional view taken along the line V-V in FIG. 4.

FIG. 5 is a cross-sectional view taken along the line V-V in FIG. 4. For convenience of explanation, a region where an oxide thin film transistor is located is defined as a switching region TrA.

In the array substrate of the present invention, an oxide semiconductor layer 105 is formed in the switching region TrA on a transparent insulating substrate 101. The substrate 101 may be formed of glass or plastic. The oxide semiconductor layer 105 includes an active area 105*a* and source and drain areas 105*b* and 105*c*. The active area 105*a* overlaps with the gate electrode and is not treated by plasma. The source and drain areas 105*b* and 105*c* are disposed at both sides of the active area 105*a*, respectively, and are treated by plasma to have conducting properties. The oxide semiconductor layer 105 has a bent portion and has an L-like shape in a plan view.

The oxide semiconductor layer 105 is formed of an oxide semiconductor material, such as indium gallium zinc oxide (IGZO), zinc tin oxide (ZTO) or zinc indium oxide (ZIO). The conducting property of the oxide semiconductor material is improved when it is plasma-treated using one or more selected from helium (He), argon (Ar) and hydrogen (H).

That is, a portion of the oxide semiconductor material, which is not plasma-treated, functions as a semiconductor that sends an electric current by forming a channel or has an insulating property when a channel is not formed, depending on on/off operations of the gate electrode 116. A portion of the oxide semiconductor material, which is plasma-treated, has the improved conducting property and functions as a conductor.

Meanwhile, a buffer layer (not shown) may be further formed between the substrate 101 and the oxide semiconductor layer 105. The buffer layer may be formed of an inorganic insulating material such as silicon oxide or silicon nitride, for example.

A gate insulating layer 109 is formed on the oxide semiconductor layer 105 including the active area 105*a* and the source and drain areas 105*b* and 105*c*. The gate insulating layer 109 corresponds to the active area 105*a*. The gate insulating layer 109 may be formed of an inorganic insulating material such as silicon oxide or silicon nitride, for example.

A gate electrode 116 is formed on the gate insulating layer 109 corresponding to the active area 105*a* of the oxide semiconductor layer 105.

Although not shown in the figure, a gate line 113 of FIG. 4 is formed with the gate electrode 116, and the gate insulating layer 109 is formed under the gate line 113 of FIG. 4. A part of the gate line 113 of FIG. 4 is the gate electrode 116.

The gate insulating layer 109, the gate line 113 of FIG. 4 and the gate electrode 116 are patterned and formed through the same mask process, and the gate insulating layer 109 has the same plane structure as the gate line 113 of FIG. 4 and the gate electrode 116.

This is to form the source and drain areas 105*b* and 105*c* of the oxide semiconductor layer 105. Namely, the gate insulating layer 109, the gate line 113 of FIG. 4 and the gate electrode 116 are patterned through the same mask process, and a surface of the oxide semiconductor layer 105 are exposed at both sides of the gate insulating layer 109. Then, a plasma treatment process is performed onto the exposed surface of the oxide semiconductor layer 105 to thereby form the source and drain areas 105*b* and 105*c* of the oxide semiconductor layer 105.

Next, an inter insulating layer 120 is formed on the gate line 113 of FIG. 4 and the gate electrode 116 all over the substrate 10. The inter insulating layer 120 may be formed of an inorganic insulating material such as silicon oxide or silicon nitride, for example.

The inter insulating layer 120 has first and second semiconductor contact holes 122*a* and 122*b* exposing the source and drain areas 105*b* and 105*c*, respectively. Here, the first and second semiconductor contact holes 122*a* and 122*b* are disposed in different pixel regions (including a data line of the pixel regions). That is, the first semiconductor contact hole 122*a* is disposed in a second pixel region P2 or a data line beside the second pixel region P2 adjacent to a first pixel region P1, and the second semiconductor contact hole 122*b* is disposed in the first pixel region P1.

A source electrode 133 and a drain electrode 136 are formed in the switching region TrA on the inter insulating layer 120. The source and drain electrodes 133 and 136 are spaced apart from each other. The source electrode 133 contacts the source area 105*b* of the oxide semiconductor layer 105 through the first semiconductor contact hole 122*a*, and the drain electrode 136 contacts the drain area 105*c* of the oxide semiconductor layer 105 through the second semiconductor contact hole 122*b*.

In the meantime, a data line 130 of FIG. 4 is formed on the inter insulating layer 120. The data line 130 of FIG. 4 crosses the gate line 113 of FIG. 4 to thereby define the first and second pixel regions P1 and P2. A part of the data line 130 of FIG. 4 is the source electrode 133.

The oxide semiconductor layer 105, the gate insulating layer 109, the gate electrode 116, the inter insulating layer 120 having the first and second semiconductor contact holes 122*a* and 122*b*, and the source and drain electrodes 133 and 136, which are sequentially formed in the switching region TrA, constitute the oxide thin film transistor Tr, a switching element.

A passivation layer 140 is formed on the oxide thin film transistor Tr over an entire surface of the substrate 101. The passivation layer 140 is formed of an inorganic insulating material such as silicon oxide and silicon nitride or an organic insulating material such as benzocyclobutene (BCB) and photo acryl.

The passivation layer 140 has a drain contact hole 143 exposing the drain electrode 136. The drain contact hole 143 overlaps the second semiconductor contact hole 122*b*. This results in an increase in the aperture ratio of the first and second pixel regions P1 and P2.

A pixel electrode 150 is formed on the passivation layer 140 having the drain contact hole 143 at each pixel region P1 and P2. The pixel electrode 150 contacts the drain electrode 136 through the drain contact hole 143.

Although not shown in the figure, a common line may be further formed on the same layer as and parallel to the gate line 113 of FIG. 4 or the data line 130 of FIG. 4 dependent on a mode of a liquid crystal display device. A common electrode may be further formed and connected to the common line.

A method of fabricating an array substrate according to the present invention will be described.

FIGS. 6A to 6I are cross-sectional views of an array substrate in steps of a method of fabricating the same according to an embodiment of the invention and show cross-sections taken along the line V-V in FIG. 4. For convenience of explanation, an area where an oxide thin film transistor is formed is defined as a switching region TrA. Here, the switching region TrA are disposed across two pixel regions P1 and P2 adjacent to each other along a direction parallel to a data line.

Figure 6A:
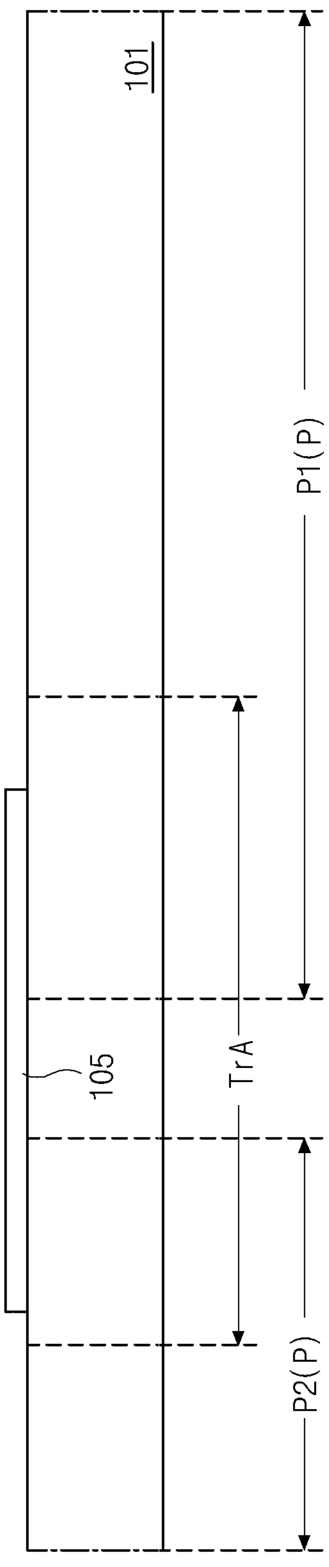
FIGS. 6A to 6I are cross-sectional views of an array substrate in steps of a method of fabricating the same according to an embodiment of the invention and show cross-sections taken along the line V-V in FIG. 4.

In FIG. 6A, an oxide semiconductor material layer (not shown) is formed on a transparent insulating substrate 101 by depositing or applying an oxide semiconductor material. The oxide semiconductor material may have an increased conducting property when it is treated by plasma using certain gases for a predetermined time and may be selected from indium gallium zinc oxide (IGZO), zinc tin oxide (ZTO) and zinc indium oxide (ZIO), for example.

A buffer layer (not shown) may be further formed on the substrate 101 by depositing silicon oxide or silicon nitride before forming the oxide semiconductor material layer.

Then, the oxide semiconductor material layer is patterned by performing a mask process including steps of applying photoresist, exposing to light, developing and etching, thereby forming an oxide semiconductor layer 105 at each switching region TrA. The oxide semiconductor layer 105 has a bent portion and has an L-like shape.

Figure 6B:
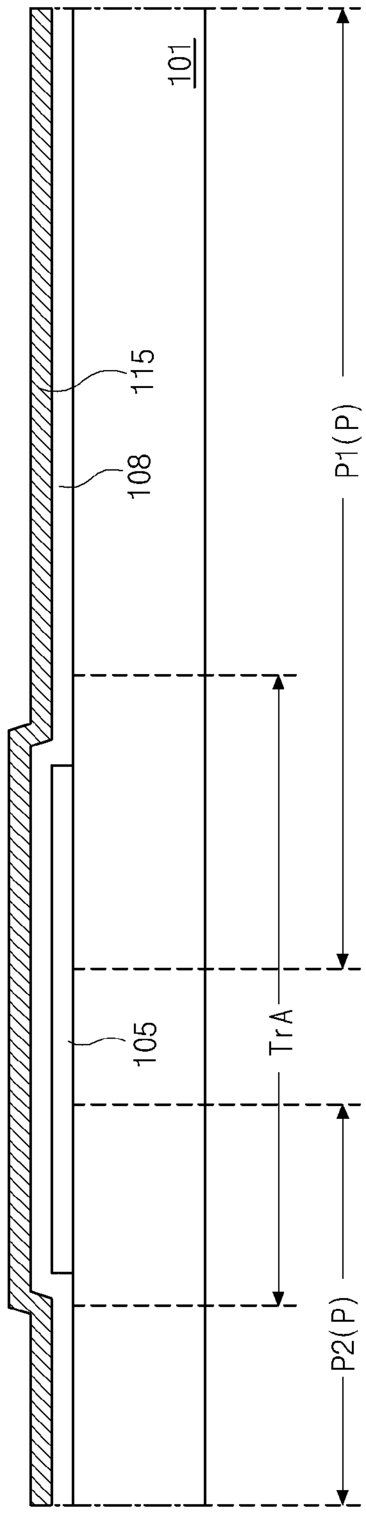

Next, in FIG. 6B, a first insulating layer 108 is formed on the oxide semiconductor layer 105 having the L-like shape by depositing an inorganic insulating material such as silicon oxide or silicon nitride, and subsequently a first metallic layer 115 is formed on the first insulating layer 108 by depositing a first metallic material. The first metallic material may be one ore more selected from copper (Cu), copper alloy, aluminum (Al), aluminum alloy such as aluminum neodymium (AlNd), molybdenum (Mo) and molybdenum alloy such as molybdenum titanium (MoTi), and the first metallic layer 115 may have a single-layered structure or a multi-layered structure.

Figure 6C:
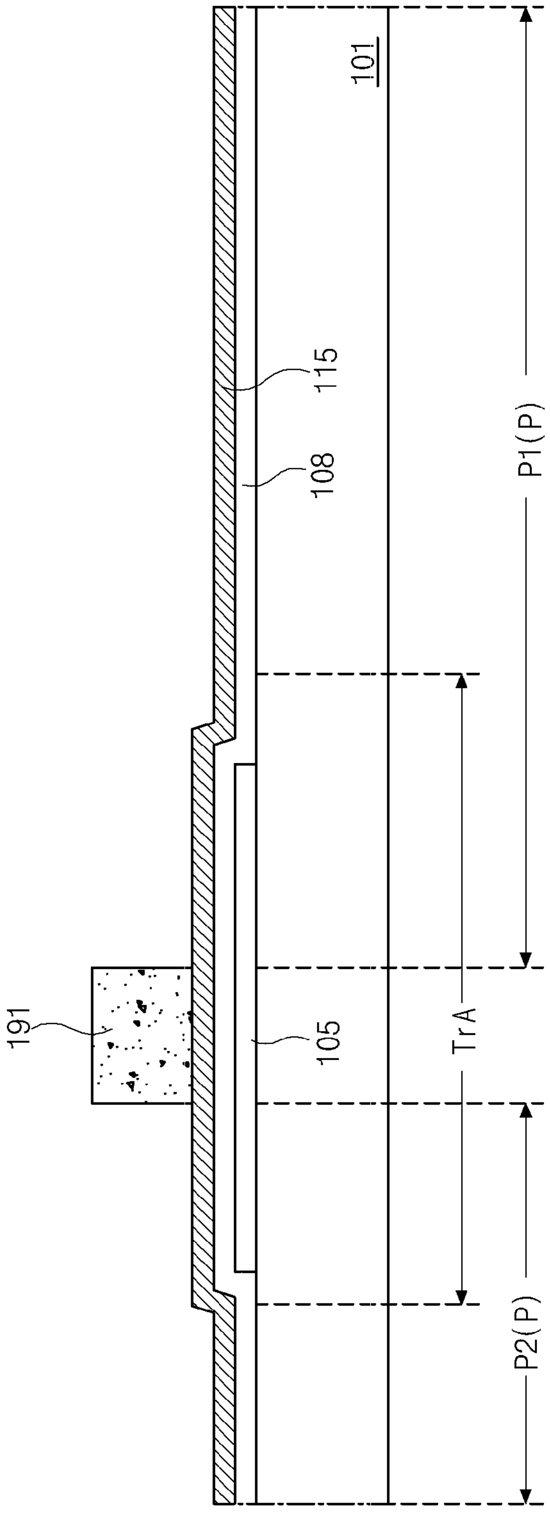

In FIG. 6C, a photoresist layer (not shown) is formed on the first metallic layer 115 by applying photoresist and is patterned, thereby forming a first photoresist pattern 191. The first photoresist pattern 191 corresponds to a portion where a gate line 113 of FIG. 4 and a gate electrode 116 of FIG. 6D are formed.

Figure 6D:
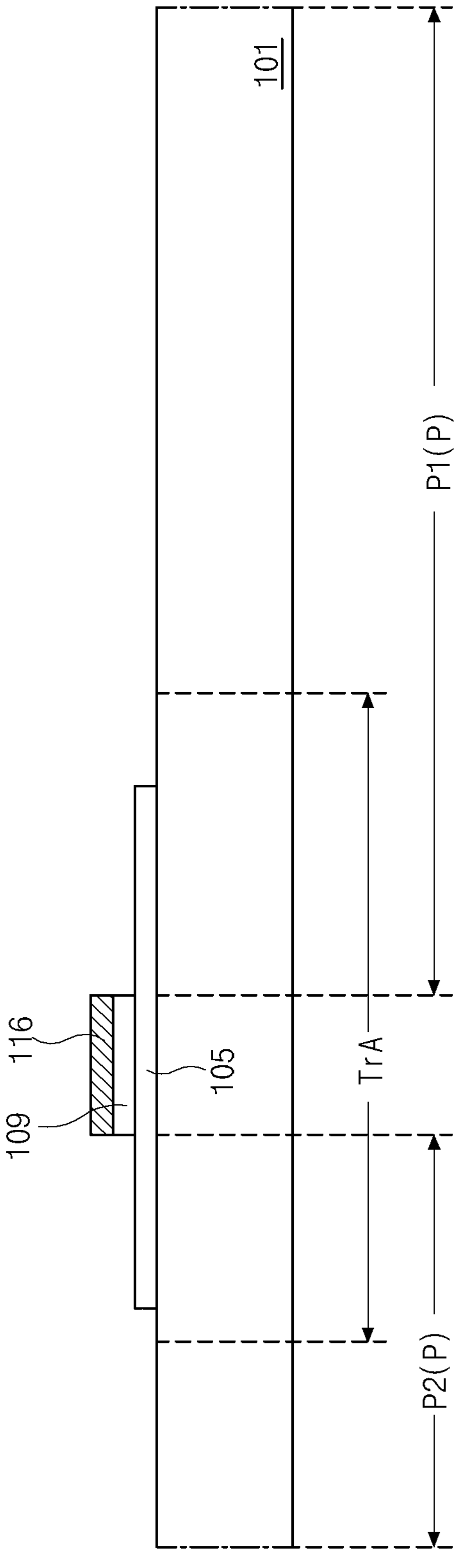

In FIG. 6D, the gate line 113 of FIG. 4 and the gate electrode 116 are formed on the first insulating layer 108 of FIG. 6C by removing a portion of the first metallic layer 115 of FIG. 6C using the first photoresist pattern 191 as an etching mask. The gate line 113 of FIG. 4 extends along a first direction, and the gate electrode 116 is disposed in the switching region TrA and connected to the gate line 113 of FIG. 4.

Here, a part of the gate line 113 of FIG. 4, which overlaps the oxide semiconductor layer 105, becomes the gate electrode 116.

Subsequently, the first insulating layer 108 of FIG. 6C exposed by removing the first metallic layer 115 of FIG. 6C is etched and removed, thereby forming a gate insulating layer 109. The gate insulating layer 109 has the same shape as the gate line 113 of FIG. 4 and the gate electrode 116 in a plan structure.

After forming the gate insulating layer 109, the first photoresist pattern 191 of FIG. 6C on the gate line 113 of FIG. 4 and the gate electrode 116 is removed by performing a stripping or ashing process.

Therefore, the oxide semiconductor layer 105, which has an island shape and is disposed at the switching region TrA, is exposed except for a portion overlapped by the gate electrode 116. Selectively removing the first insulating layer 108 of FIG. 6C and partially exposing the oxide semiconductor layer 105 are to increase a conducting property of a portion of the oxide semiconductor layer 105 through a plasma process performed later.

Figure 6E:
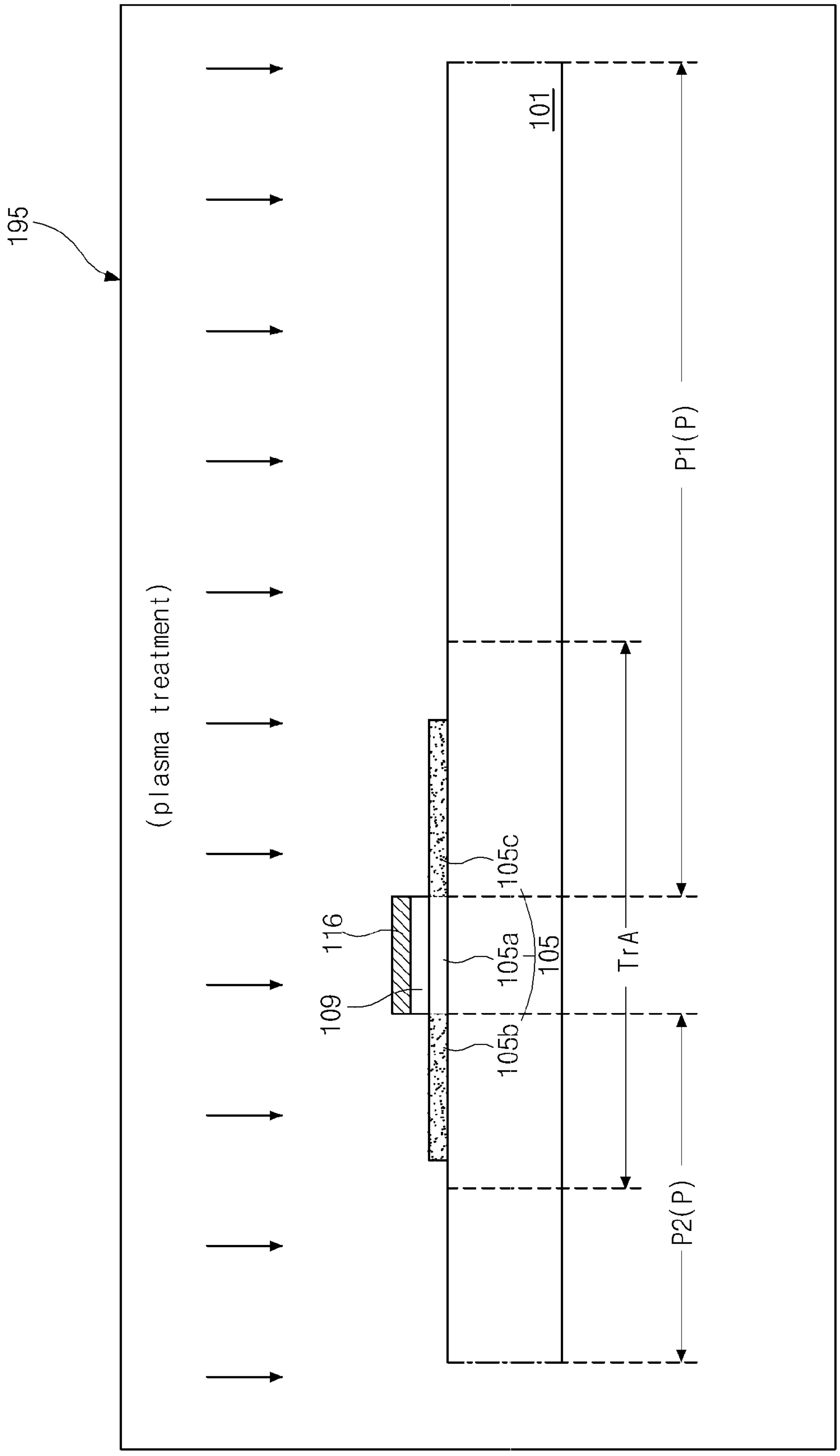

Next, in FIG. 6E, the substrate 101 including the gate line 113 of FIG. 4, the gate electrode 116, and the partially exposed oxide semiconductor layer 105 is located in a vacuum chamber and is exposed to plasma, which is generated by providing the vacuum chamber with one or more selected from helium (He), argon (Ar) and hydrogen (H), for a predetermined time, for example, 30 seconds to 150 seconds. The oxide semiconductor layer 105 exposed to the plasma for the predetermined time has an increased conducting property to thereby function as a conductor and has an ohmic property.

Here, the oxide semiconductor layer 105 includes an active area 105*a* and source and drain areas 105*b* and 105*c*. The active area 105*a* is under the gate electrode 116 and is not exposed to the plasma. The source and drain areas 105*b* and 105*c* are disposed at both sides of active area 105*a* and are exposed to the plasma.

For example, indium gallium zinc oxide (IGZO) for the oxide semiconductor layer 105 generally has a sheet resistance of several thousands to several ten thousands ohm/sq, and IGZO exposed to the plasma may have a sheet resistance of 30 to 1000 ohm/sq.

Figure 6F:
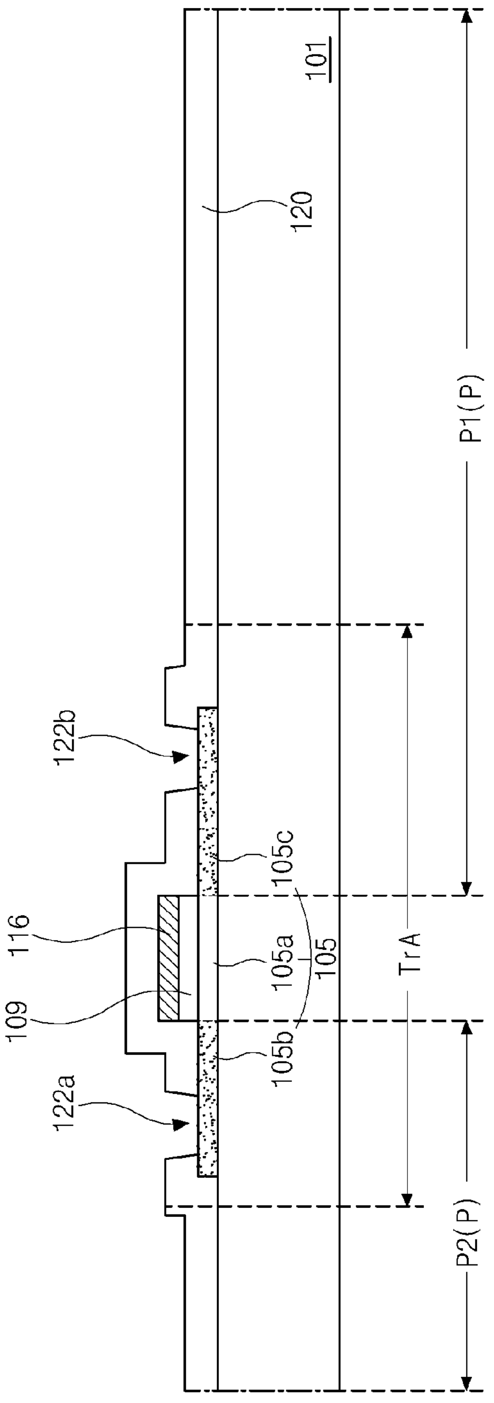

Next, in FIG. 6F, an inter insulating layer 120 is formed on the gate line 113 of FIG. 4 and the gate electrode 116 by depositing an inorganic insulating material such as silicon oxide or silicon nitride substantially over an entire surface of the substrate 101.

Then, the inter insulating layer 120 is patterned through a mask process, thereby forming first and second semiconductor contact holes 122*a* and 122*b*. The first and second semiconductor contact holes 122*a* and 122*b* expose the source and drain areas 105*b* and 105*c* of the oxide semiconductor layer 105 at the switching region TrA, respectively.

At this time, the first semiconductor contact hole 122*a* is disposed in the second pixel region P2 (including a data line beside the second pixel region P2) where the source area 105*b* of the oxide semiconductor layer 105 having the bent portion is located, and the second semiconductor contact hole 122*b* is disposed in the first pixel region P1 where the drain area 105*c* of the oxide semiconductor layer 105 is located.

Figure 6G:
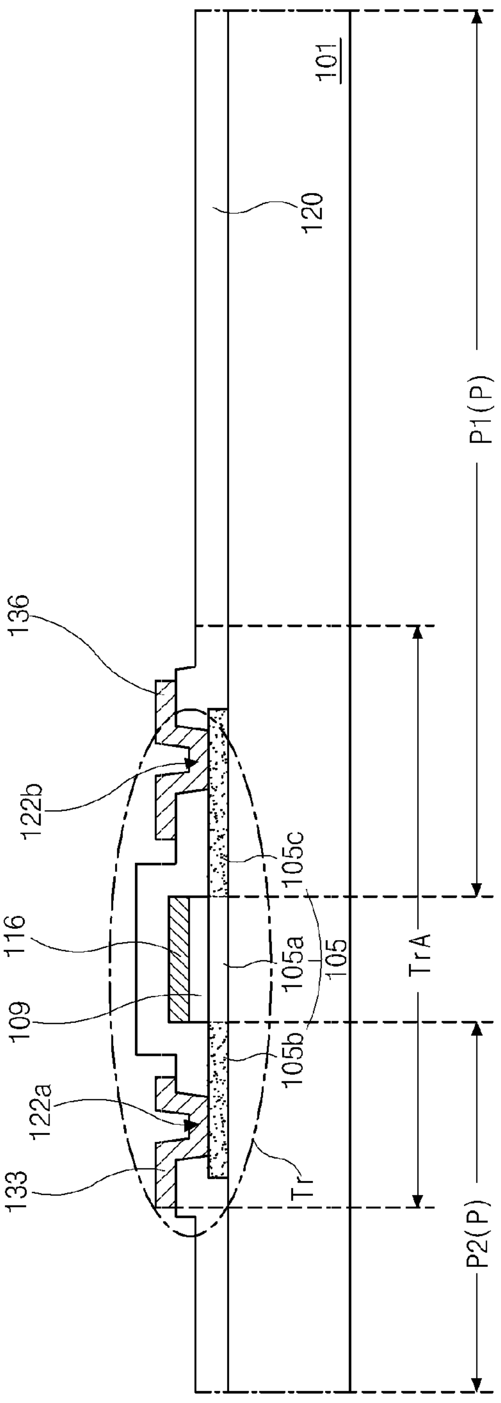

In FIG. 6G, a second metallic layer (not shown) is formed on the inter insulating layer 120 having the first and second semiconductor contact holes 122*a* and 122*b* by depositing a second metallic material. The second metallic material may be one or more selected from copper (Cu), copper alloy, aluminum (Al), aluminum alloy such as aluminum neodymium (AlNd), molybdenum (Mo) and molybdenum alloy such as molybdenum titanium (MoTi), and the second metallic layer may have a single-layered structure or a multi-layered structure.

Next, the second metallic layer is patterned through a mask process, thereby forming a data line 130 of FIG. 4 and source and drain electrodes 133 and 136 on the inter insulating layer 120. The data line 130 of FIG. 4 extends along a second direction and crosses the gate line 113 of FIG. 4 to define the first and second pixel regions P1 and P2. The source electrode 133 and the drain electrode 136 are disposed in the switching region TrA. The source electrode 133 is connected to the data line 130 of FIG. 4 and contacts the source area 105*b* through the first semiconductor contact hole 122*a*. The drain electrode 136 contacts the drain area 105*c* through the second semiconductor contact hole 122*b*.

Here, a part of the data line 130 of FIG. 4 becomes the source electrode 133.

The oxide semiconductor layer 105 including the active area 105*a* and the source and drain areas 105*b* and 105*c*, the gate insulating layer 109, the gate electrode 116, the inter insulating layer 120 having the first and second semiconductor contact holes 122*a* and 122*b*, and the source and drain electrodes 133 and 136, which are sequentially formed at the switching region TrA, constitute an oxide thin film transistor Tr, which is a switching element.

As mentioned above, the source electrode 133 of the oxide thin film transistor Tr is disposed in the data line beside the second pixel region P2, and the drain electrode 136 of the oxide thin film transistor Tr is disposed in the first pixel region P1. The oxide thin film transistor Tr is formed across two pixel regions P1 and P2.

Figure 6H:
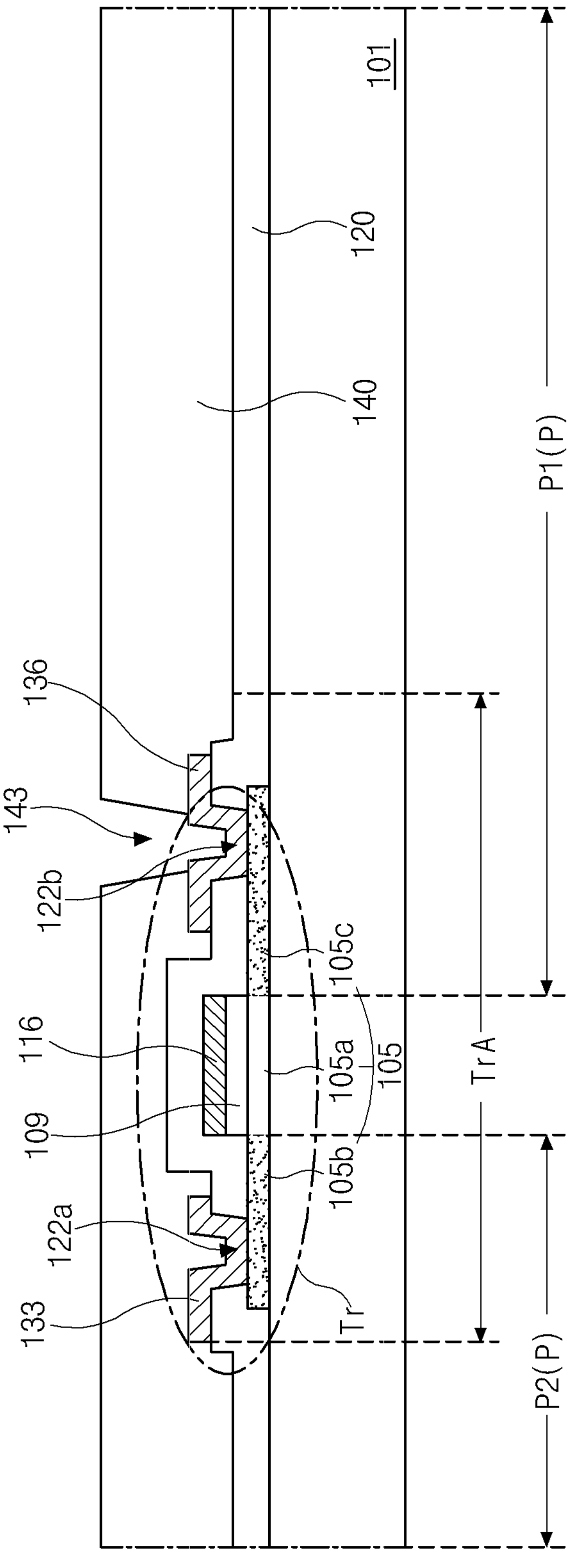

In FIG. 6H, a passivation layer 140 is formed on the data line 130 of FIG. 4 and the source and drain electrodes 133 and 136 by depositing an inorganic insulating material or applying an organic insulating material over a substantially entire surface of the substrate 101. For example, the inorganic insulating material may be silicon oxide or silicon nitride, and the organic insulating material may be benzocyclobutene (BCB) or photo acryl.

The passivation layer 140 is patterned through a mask process, thereby forming a drain contact hole 143. The drain contact hole 143 exposes the drain electrode 136 and overlaps the second semiconductor contact hole 122*b*.

Figure 6I:
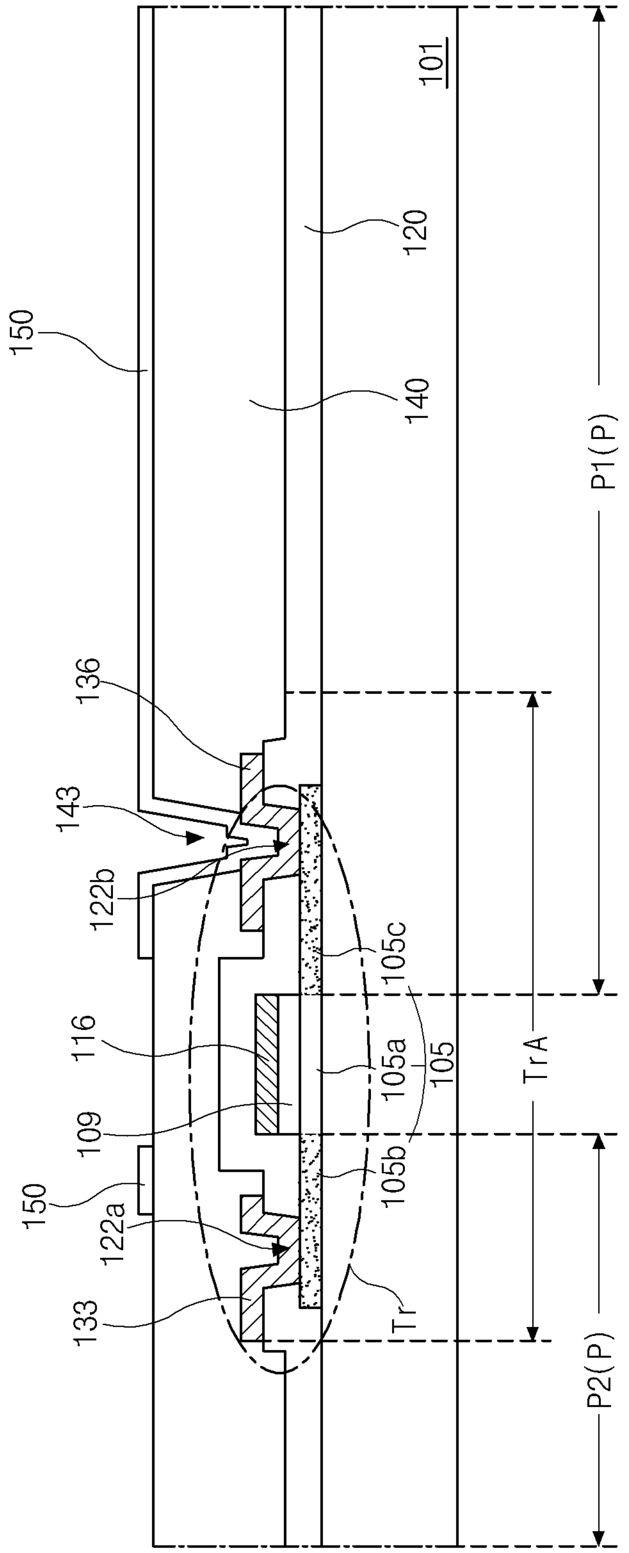

Then, in FIG. 6*i*, a pixel electrode 150 is formed at each pixel region P1 and P2 on the passivation layer 140 having the drain contact hole 143 by depositing a third metallic material or a transparent conductive material and patterning it through a mask process. The pixel electrode 150 contacts the drain electrode 136 through the drain contact hole 143. For example, the third metallic material may be molybdenum (Mo) or molybdenum titanium (MoTi), and the transparent conductive material may be indium tin oxide (ITO) or indium zinc oxide (IZO).

Accordingly, the array substrate according to the embodiment of the present invention is completed.

Meanwhile, although not shown in the figures, forming the gate line 113 of FIG. 4 or forming the data line 130 of FIG. 4 may include forming a common line, which is parallel to the gate line 113 of FIG. 4 or the data line 130 of FIG. 4, forming the drain contact hole 143 may include forming a common contact hole exposing the common line, and forming the pixel electrode 150 may include forming a common electrode, which contacts the common line through the common contact hole and alternate the pixel electrode 150, wherein each of the pixel electrode 150 and the common electrode has a plurality of bar-shaped patterns.

In the array substrate of the present invention, the oxide thin film transistor Tr is formed across the first and second pixel regions P1 and P2 adjacent to each other along the second direction, and the first and second semiconductor contact holes 122*a* and 122*b* exposing the source and drain areas 105*b* and 105*c* of the oxide semiconductor layer 105 are arranged along the first direction parallel to a length of the first and second pixel regions P1 and P2, which is longer than a width of the first and second pixel regions P1 and P2. Accordingly, even though a size of the first and second pixel regions P1 and P2 decreases for high definition, it is possible to form an oxide thin film transistor Tr having a coplanar structure.

Furthermore, the oxide thin film transistor Tr includes the part of the gate line 113 of FIG. 4 as the gate electrode 116 and the part of the data line 130 of FIG. 4 as the source electrode 133. Therefore, the area for the oxide thin film transistor Tr can be decreased, and the aperture ratio in each pixel region P1 and P2 can be improved.

The oxide thin film transistor Tr mentioned above can be applied not only to an array substrate for a personal portable device such as a tablet PC or a cellular phone, which is able to display a full high definition image, but also to any array substrate including a coplanar structure thin film transistor.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array substrate comprising:

a substrate;

an oxide semiconductor layer on the substrate, the oxide semiconductor layer including an active area and source and drain areas at both sides of the active area;

a gate insulating layer and a gate electrode sequentially on the active area of the oxide semiconductor layer;

a gate line on the gate insulating layer along a first direction;

an inter insulating layer on the gate electrode and the gate line and having first and second semiconductor contact holes that expose the source and drain areas respectively;

source and drain electrodes on the inter insulating layer and contacting the source and drain areas through the first and second semiconductor contact holes, respectively; and a data line on the inter insulating layer along a second direction, the data line crossing the gate line to define plural pixel regions, wherein the first and second semiconductor contact holes are respectively disposed in two pixel regions, and the gate line is located between the first and second semiconductor contact holes.

2. The array substrate according to claim 1, wherein the oxide semiconductor layer has a bent portion in plan view, and both ends of the bent portion correspond to the first and second semiconductor contact holes respectively.

3. The array substrate according to claim 2, wherein the bent portion has an L-like shape.

4. The array substrate according to claim 1, wherein the two regions are arranged across two pixel regions adjacent to each other along the second direction in a direction parallel to a length of one pixel region, which is longer than a width of the one pixel region.

5. The array substrate according to claim 1, wherein the two regions are adjacent to each other along the second direction and one of the two regions is the last pixel region connected to the last gate line where the second semiconductor contact hole for the last pixel region is formed, and another of the two regions is a region where the first semiconductor contact hole for the last pixel region connected to the last gate line is formed in correspondence to the data line extending in a non-display region.

6. The array substrate according to claim 1, wherein the data line crosses the gate line to define first and second pixel regions adjacent to each other along the second direction, and wherein a part of the gate line is the gate electrode, and a part of the data line is the source electrode.

7. The array substrate according to claim 6, wherein the drain electrode is located in the first pixel region and the source electrode is located in the data line beside the second pixel region.

8. The array substrate according to claim 1, wherein the oxide semiconductor layer is formed of an oxide semiconductor material which has an increased conducting property when it is exposed to plasma using one or more selected from helium, argon and hydrogen.

9. The array substrate according to claim 8, wherein the oxide semiconductor material includes one of indium gallium zinc oxide, zinc tin oxide, and zinc indium oxide.

10. The array substrate according to claim 8, wherein the active area is a portion of the oxide semiconductor layer which overlaps the gate electrode and is not treated by plasma, and the source and drain areas are portions of the oxide semiconductor layer which do not overlap the gate electrode and treated by plasma to have improved conducting properties.

11. The array substrate according to claim 1, further comprising:

a passivation layer on the source and drain electrodes and having a drain contact hole exposing the drain electrode; and a pixel electrode on the passivation layer and contacting the drain electrode through the drain contact hole, wherein the drain contact hole overlaps the second semiconductor contact hole.

* * * * *